(12) United States Patent
Wu et al.

(10) Patent No.: US 12,428,750 B2
(45) Date of Patent: Sep. 30, 2025

(54) INGOT PULLER APPARATUS HAVING SILICON FEED TUBES WITH KICK PLATES

(71) Applicant: GlobalWafers Co., Ltd., Hsinchu (TW)

(72) Inventors: Chun-Sheng Wu, Hsinchu (TW); Hong-Huei Huang, Zhubei (TW); Wei-Chen Chou, Taipei (TW); Chen-Yi Lin, Zhunan Township (TW); Feng-Chien Tsai, Zhubei (TW); Zheng Lu, O'Fallon, MO (US)

(73) Assignee: Globalwafers Co., Ltd., Hsinchu (TW)

( * ) Notice: Subject to any disclaimer, the term of this patent is extended or adjusted under 35 U.S.C. 154(b) by 97 days.

(21) Appl. No.: 18/163,635

(22) Filed: Feb. 2, 2023

(65) Prior Publication Data
US 2023/0272552 A1 Aug. 31, 2023

Related U.S. Application Data

(60) Provisional application No. 63/313,988, filed on Feb. 25, 2022.

(51) Int. Cl.
*C30B 15/20* (2006.01)
*C30B 15/10* (2006.01)
*C30B 29/06* (2006.01)

(52) U.S. Cl.
CPC .............. *C30B 29/06* (2013.01); *C30B 15/10* (2013.01); *C30B 15/20* (2013.01)

(58) Field of Classification Search
CPC .......... C30B 15/20; C30B 29/06; C30B 15/12
See application file for complete search history.

(56) References Cited

U.S. PATENT DOCUMENTS

| | | | |
|---|---|---|---|
| 5,419,462 A | 5/1995 | Johnston et al. | |
| 5,588,993 A | 12/1996 | Holder | |
| 5,690,733 A | 11/1997 | Nagai et al. | |
| 5,919,303 A | 7/1999 | Holder | |
| 6,454,851 B1 | 9/2002 | Fuerhoff et al. | |
| 6,896,732 B2 | 5/2005 | Fickett et al. | |
| 8,480,345 B2 | 7/2013 | Hsu et al. | |
| 10,577,717 B2 | 3/2020 | Yun et al. | |
| 11,085,126 B2 | 8/2021 | Yun et al. | |
| 2003/0101924 A1 | 6/2003 | Holder | |
| 2003/0159647 A1* | 8/2003 | Arvidson | C30B 15/002 117/30 |
| 2012/0266808 A1 | 10/2012 | Luter et al. | |
| 2013/0098290 A1 | 4/2013 | Luter et al. | |
| 2013/0220215 A1* | 8/2013 | Eidelman | C30B 15/002 117/214 |

FOREIGN PATENT DOCUMENTS

| | | |
|---|---|---|
| CN | 102140685 A | 8/2011 |
| CN | 102242395 A | 11/2011 |
| CN | 202671709 U | 1/2013 |
| CN | 109183140 A | 1/2019 |

(Continued)

*Primary Examiner* — Robert M Kunemund
(74) *Attorney, Agent, or Firm* — Armstrong Teasdale LLP

(57) ABSTRACT

Ingot puller apparatus that include a silicon feed tube for adding solid silicon to a crucible assembly are disclosed. The silicon feed tubes include a conduit portion having an inner diameter and a kick plate disposed below the conduit portion. The kick plate extends across at least 60% of the inner diameter of the conduit portion.

9 Claims, 12 Drawing Sheets

Unbalance island (pyramidal shape)

Balance island (volcano shape)

(56) References Cited

FOREIGN PATENT DOCUMENTS

| | | |
|---|---|---|
| CN | 111074336 A | 4/2020 |
| EP | 0771891 A1 | 5/1997 |
| EP | 1338682 A2 | 8/2003 |
| EP | 1553214 A2 | 7/2005 |
| WO | 2014185572 A1 | 11/2014 |
| WO | 2017031328 A1 | 2/2017 |
| WO | 2019124073 A1 | 6/2019 |
| WO | 20221080094 A1 | 4/2021 |

* cited by examiner

Unbalance island (pyramidal shape)

Balance island (volcano shape)

US 12,428,750 B2

INGOT PULLER APPARATUS HAVING SILICON FEED TUBES WITH KICK PLATES

CROSS-REFERENCE TO RELATED APPLICATIONS

This application claims the benefit of U.S. Provisional Patent Application No. 63/313,988, filed Feb. 25, 2022, which is incorporated herein by reference in its entirety.

FIELD OF THE DISCLOSURE

The field of the disclosure relates to ingot puller apparatus having a silicon feed tube for adding solid silicon to a crucible assembly and, in particular, silicon feed tubes having a kick plate at the outlet of the silicon feed tube.

BACKGROUND

Single crystal silicon ingots may be grown by the so-called Czochralski process in which a silicon seed crystal is contacted with a melt of silicon. The silicon seed crystal is withdrawn from the melt causing a single crystal silicon ingot suspended by the seed crystal to form. In batch Czochralski methods, the melt is formed by adding an initial charge of solid silicon to the crucible assembly and melting the charge. Additional solid silicon may be added to this initial melt to form a floating cluster or "island" of solid silicon on top of the silicon melt. The portion of the island that contacts the melt liquifies thereby increasing the size of the melt. If the rate of solid silicon added to the crucible assembly is greater than the melt rate, the size of the island increases. As the island grows, the island may become unbalanced and may tilt or even overturn into the melt. In such cases the feeding of solid silicon is stopped and heater power is controlled to prevent the tilted or overturned island from colliding with the hotzone. A need exists for ingot puller apparatus which produce a more stable island of solid silicon and/or which reduce melt down time and/or heater power.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to an ingot puller apparatus for manufacturing a single crystal silicon ingot. The ingot puller apparatus includes a crucible assembly for holding a silicon melt. A crystal puller housing defines a growth chamber for pulling a silicon ingot from the silicon melt. The crucible assembly is disposed within the growth chamber. The apparatus includes a silicon feed tube for adding solid silicon to the crucible assembly. The silicon feed tube includes a conduit portion having an inner diameter and includes a kick plate disposed below the conduit portion. The kick plate extends across at least 60% of the inner diameter of the conduit portion.

Another aspect of the present disclosure is directed to an ingot puller apparatus for manufacturing a single crystal silicon ingot. The ingot puller apparatus includes a crucible assembly for holding a silicon melt. A crystal puller housing defines a growth chamber for pulling a silicon ingot from the silicon melt. The crucible assembly is disposed within the growth chamber. The apparatus includes a silicon feed tube for adding solid silicon to the crucible assembly. The silicon feed tube includes a conduit portion and a kick plate partially disposed below the conduit portion. The kick plate has a height. The conduit portion overlaps less than 70% of the height of the kick plate.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

Corresponding reference characters indicate corresponding parts throughout the drawings.

DETAILED DESCRIPTION

Figure 1:
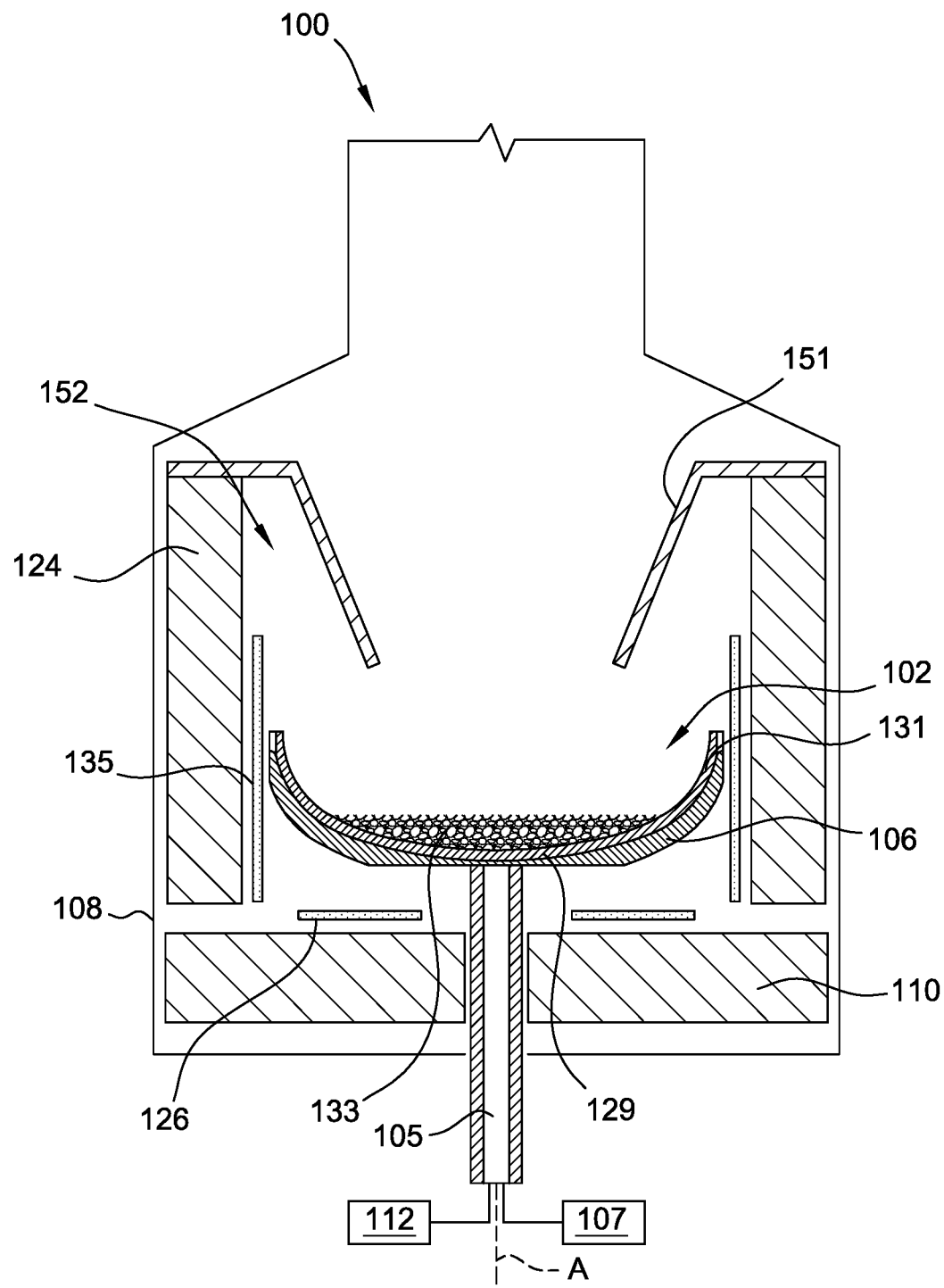
FIG. 1 is a cross-section of an example ingot puller apparatus with a silicon charge disposed in the crucible assembly.
Figure 5:
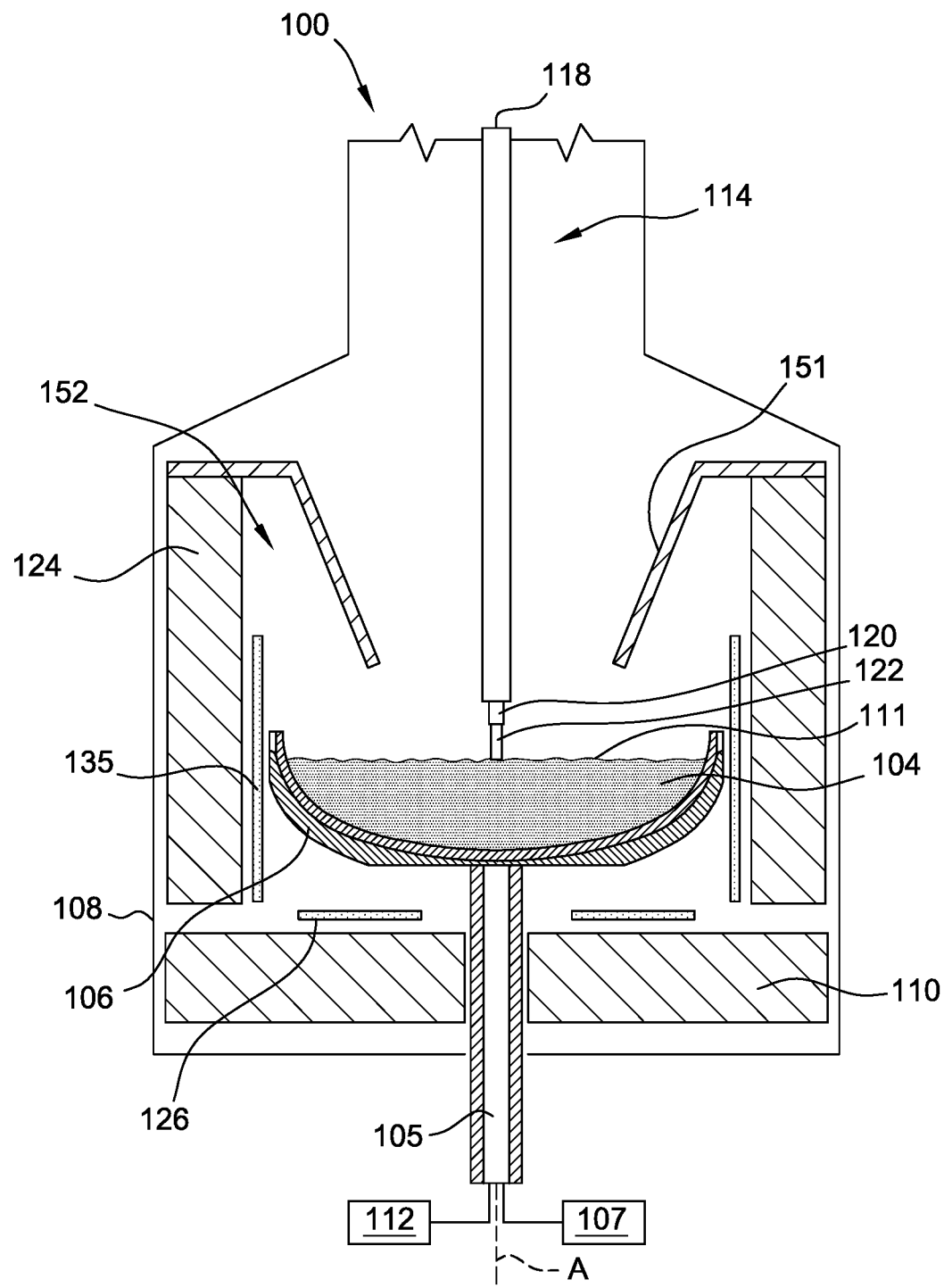
FIG. 5 is a cross-section of the ingot puller apparatus with the silicon seed crystal lowered to contact the melt to begin ingot growth.

An example ingot puller apparatus (or more simply "ingot puller") is indicated generally as "100" in FIG. 1. The ingot puller apparatus 100 includes a crucible assembly 102 for holding a melt 104 (FIG. 5) of semiconductor or solar-grade material silicon. The crucible assembly 102 is supported by a susceptor 106. The ingot puller apparatus 100 includes a crystal puller housing 108 that defines a growth chamber 152 for pulling a silicon ingot 113 (FIG. 6) from the melt 104 along a pull axis A.

The crucible assembly 102 has a sidewall 131 (FIG. 1) and floor 129 and rests on a susceptor 106. The susceptor 106 is supported by a shaft 105. The susceptor 106, crucible assembly 102, shaft 105, and ingot 113 (FIG. 6) have a common longitudinal axis or "pull axis" A.

A pulling mechanism 114 (FIG. 5) is provided within the ingot puller apparatus 100 for growing and pulling an ingot 113 (FIG. 6) from the melt 104. Pulling mechanism 114 includes a pulling cable 118, a seed holder or chuck 120 coupled to one end of the pulling cable 118, and a seed crystal 122 coupled to the seed holder or chuck 120 for initiating crystal growth. One end of the pulling cable 118 is connected to a pulley (not shown) or a drum (not shown), or any other suitable type of lifting mechanism, for example, a shaft, and the other end is connected to the chuck 120 that holds the seed crystal 122. In operation, the seed crystal 122 is lowered to contact the surface 111 (FIG. 5) of the melt 104. The pulling mechanism 114 is operated to cause the seed crystal 122 to rise. This causes a single crystal ingot 113 (FIG. 6) to be pulled from the melt 104.

During heating and crystal pulling, a crucible drive unit 107 (e.g., a motor) rotates the crucible assembly 102 and susceptor 106. A lift mechanism 112 raises and lowers the crucible assembly 102 along the pull axis A during the growth process. For example, the crucible assembly 102 may be at a lowest position (near the bottom heater 126) in which a charge of solid-phase polycrystalline silicon 133 previously added to the crucible assembly 102 is melted. Crystal growth commences by contacting the melt 104 (FIG. 5) with the seed crystal 122 and lifting the seed crystal 122 by the pulling mechanism 114.

A crystal drive unit (not shown) may also rotate the pulling cable 118 and ingot 113 (FIG. 6) in a direction opposite the direction in which the crucible drive unit 107 rotates the crucible assembly 102 (e.g., counter-rotation). In embodiments using iso-rotation, the crystal drive unit may rotate the pulling cable 118 in the same direction in which crucible drive unit 107 rotates the crucible assembly 102.

The ingot puller apparatus 100 includes bottom insulation 110 and side insulation 124 to retain heat in the puller apparatus 100. In the illustrated embodiment, the ingot puller apparatus 100 includes a bottom heater 126 disposed below the crucible floor 129. The crucible assembly 102 may be moved to be in relatively close proximity to the bottom heater 126 to melt the solid silicon charged to the crucible assembly 102 as further described below.

According to the Czochralski single crystal growth process, a quantity of solid-phase silicon 133 (FIG. 1) such as polycrystalline silicon, or "polysilicon", is initially charged to the crucible assembly 102. The semiconductor or solar-grade solid silicon that is introduced into the crucible assembly 102 is melted by heat provided from one or more heating elements. The size of the solid-phase silicon charge 133 may correspond to the desired size of the melt when ingot growth commences or, as in embodiments of the present disclosure, a smaller charge is used and additional silicon is added by a silicon feed system 200 (FIG. 3) to form the initial volume of melt present during initiation of ingot growth.

Figure 2:
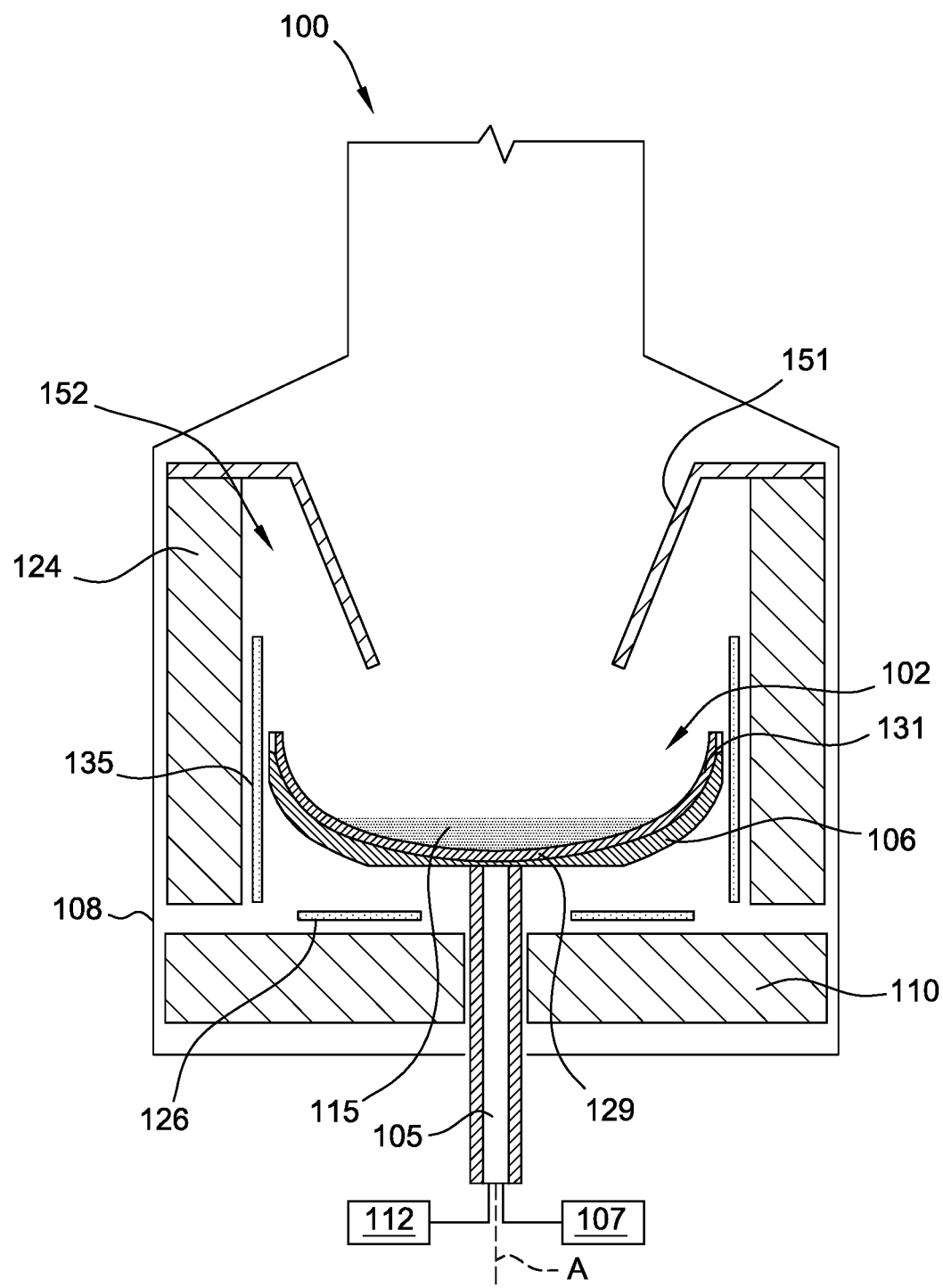
FIG. 2 is a cross-section of the ingot puller apparatus with an initial melt formed from the silicon charge.
Figure 3:
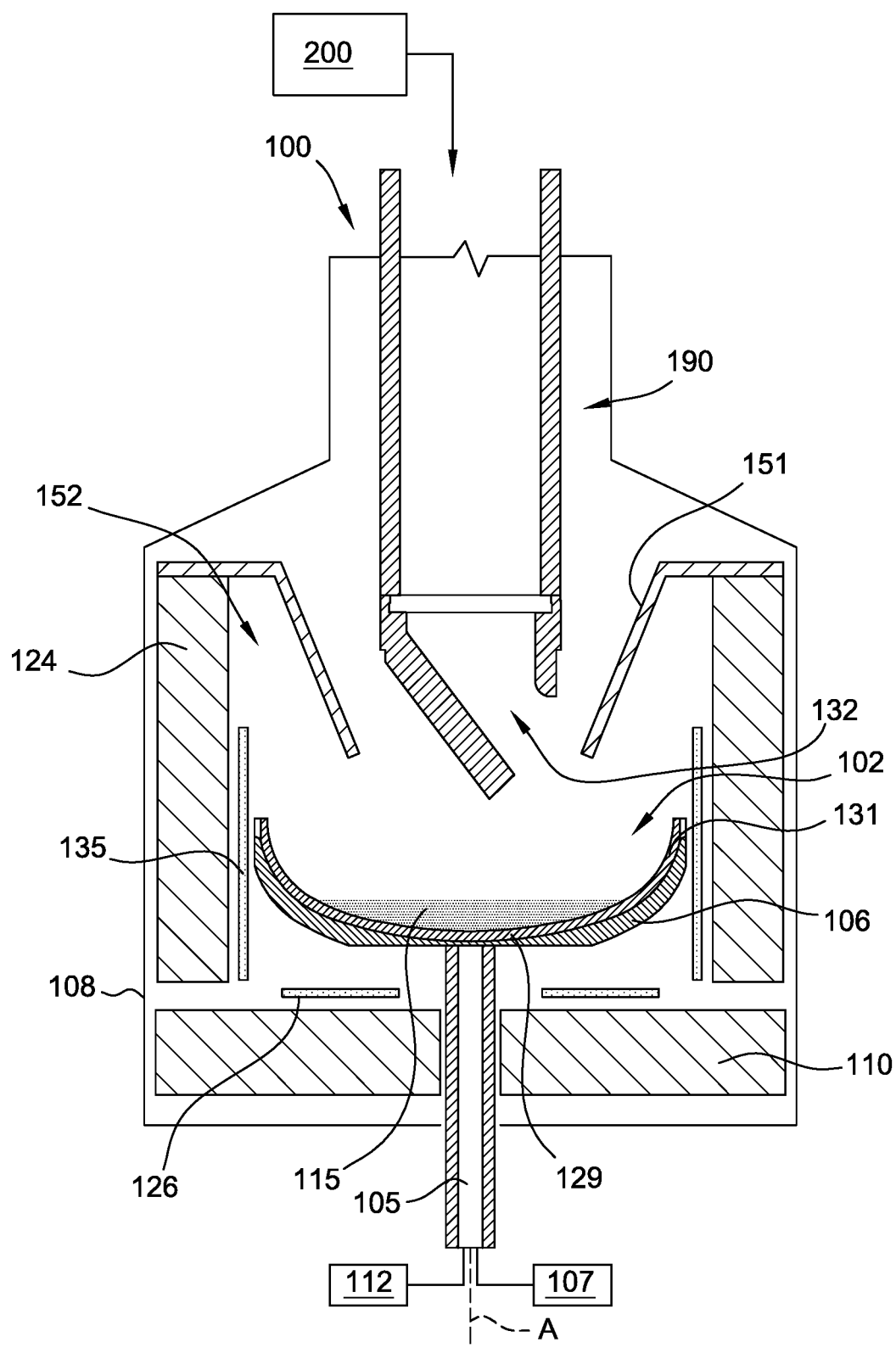
FIG. 3 is a cross-section of the ingot puller apparatus with a silicon feed tube disposed above the initial melt.

Once the initial charge of solid-phase silicon 133 is added to the crucible assembly 102, the bottom heaters 126 and side heaters 135 may be powered to melt the charge 133 and form an initial melt 115 (FIG. 2) of silicon. To form the remainder of the melt, solid silicon is added to the melt 115 by a silicon feed system 200 (FIG. 3) through a feed tube 190 (FIG. 3). The solid silicon that is fed to the crucible assembly 102 by the silicon feed system 200 may be, for example, granular, chunk, chip, or a combination of thereof. The silicon feed system 200 may include components suitable for adding solid silicon to a crucible assembly and may include a container for holding solid silicon and/or a feed tray. A vibratory motor may be powered to cause the feed tray to vibrate and move solid silicon from the container to the feed tube 190. The outlet of the feed tray may be connected to the feed tube 190. A valve mechanism may be used to seal the tube 190 (e.g., a valve mechanism removably engages the outlet of the tray) during periods in which silicon is not being added to the feed tube 190. Example components of the silicon feed system 200 are shown and described in U.S. Pat. No. 10,577,717, which is incorporated herein by reference for all relevant and consistent purposes.

Figure 4:
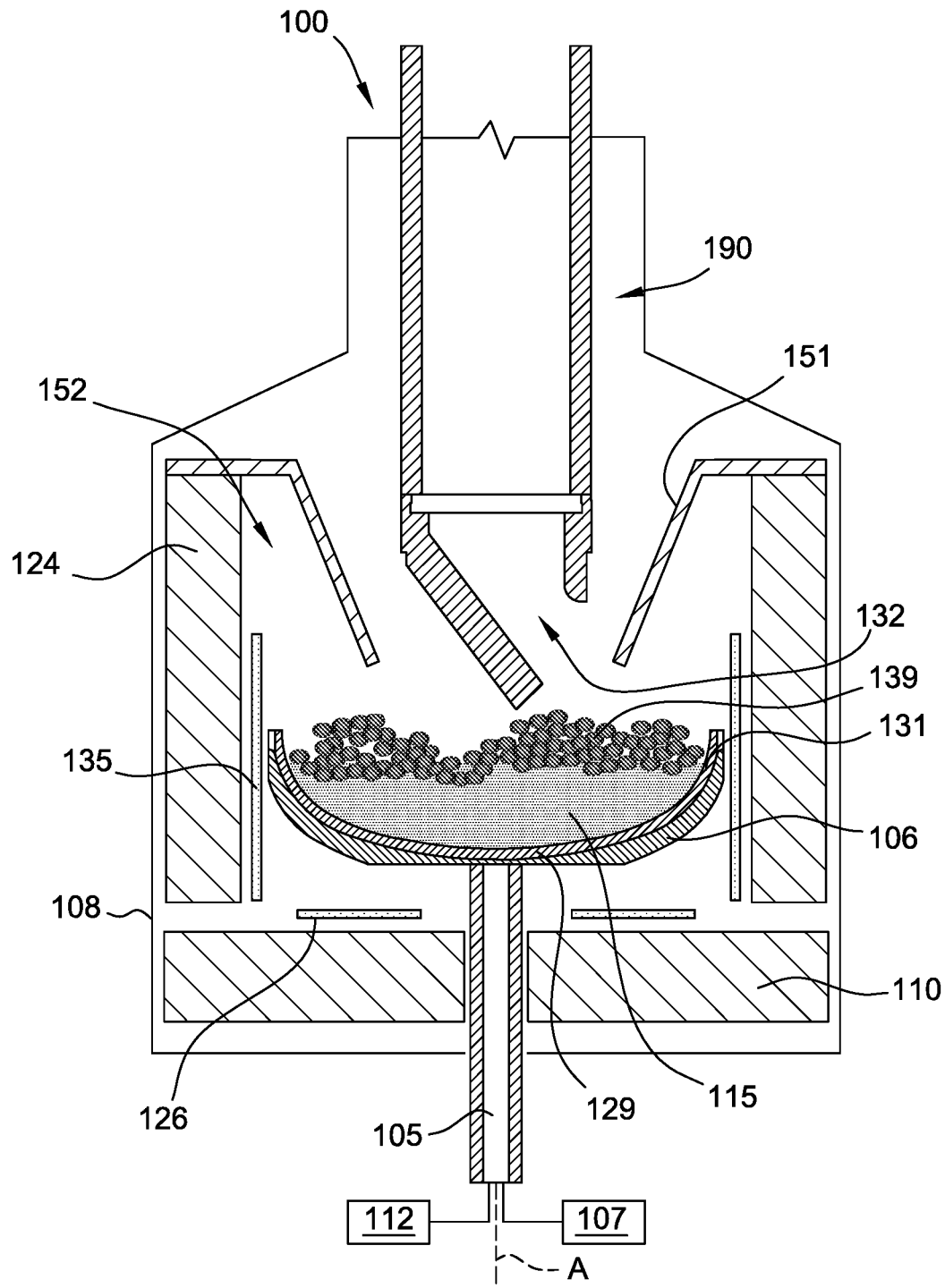
FIG. 4 is a cross-section of the ingot puller apparatus with an island of solid-silicon disposed on the silicon melt.
Figure 11:
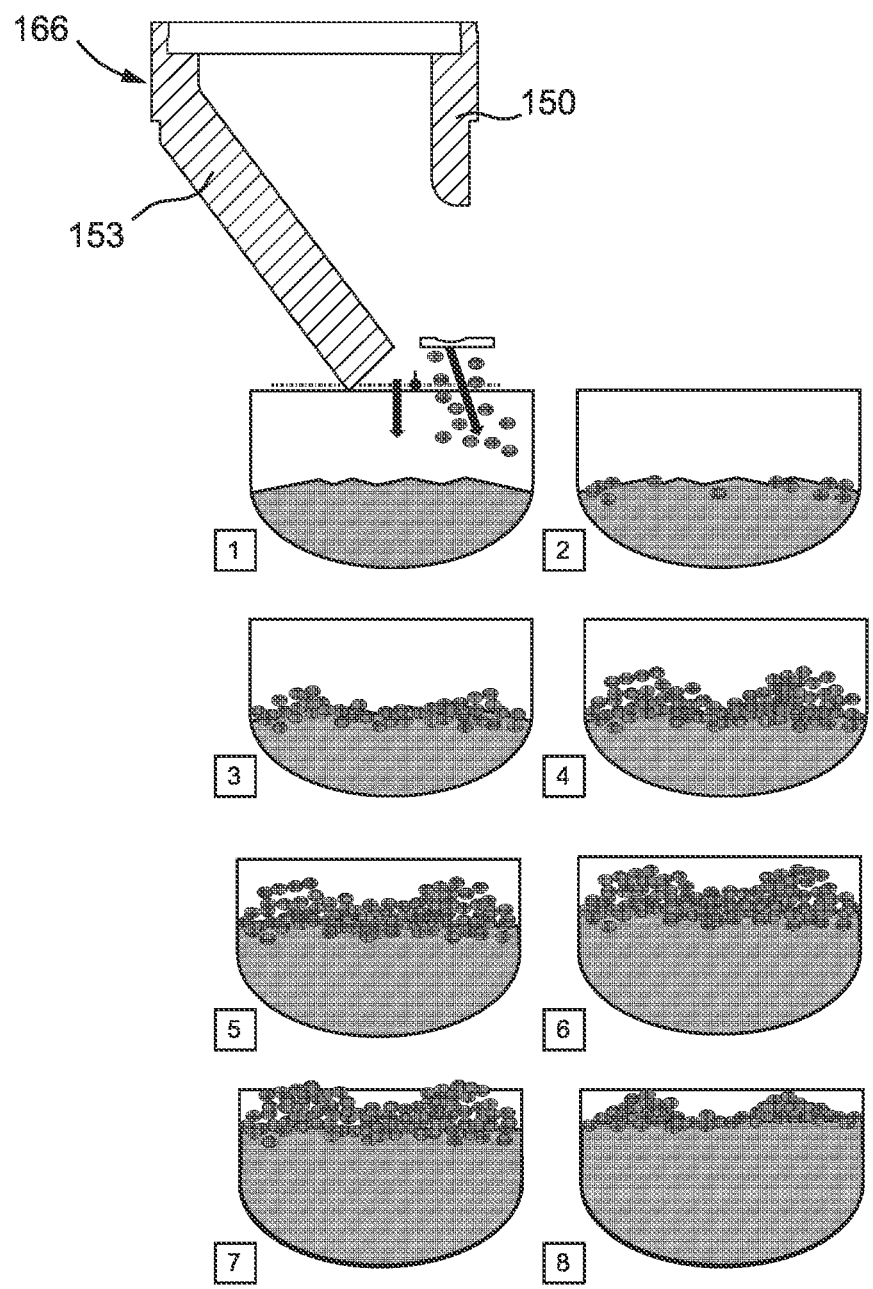
FIG. 11 is a schematic of the various stages of island formation and growth of the silicon melt.

Before adding solid silicon to the initial melt 115, the silicon feed system 200 is docked to the ingot puller apparatus 100 (e.g., via an isolation valve) and the feed tube 190 is lowered into the growth chamber 152 (e.g., by use of motorized gear system). Silicon is introduced into the silicon feed tube 190 by the silicon feed system 200. Solid silicon passes through the tube 190 and is discharged through the outlet 132 (FIG. 3) of the feed tube 190. Discharged solid silicon collects on the surface of the initial melt 115. The silicon forms an island 139 (FIG. 4) of solid silicon that floats on the melt 115. The solid silicon in the island melts, thereby increasing the size of the melt. If the rate of addition of solid silicon exceeds the melt rate, the island increases in size as shown in FIG. 11.

Figure 6:
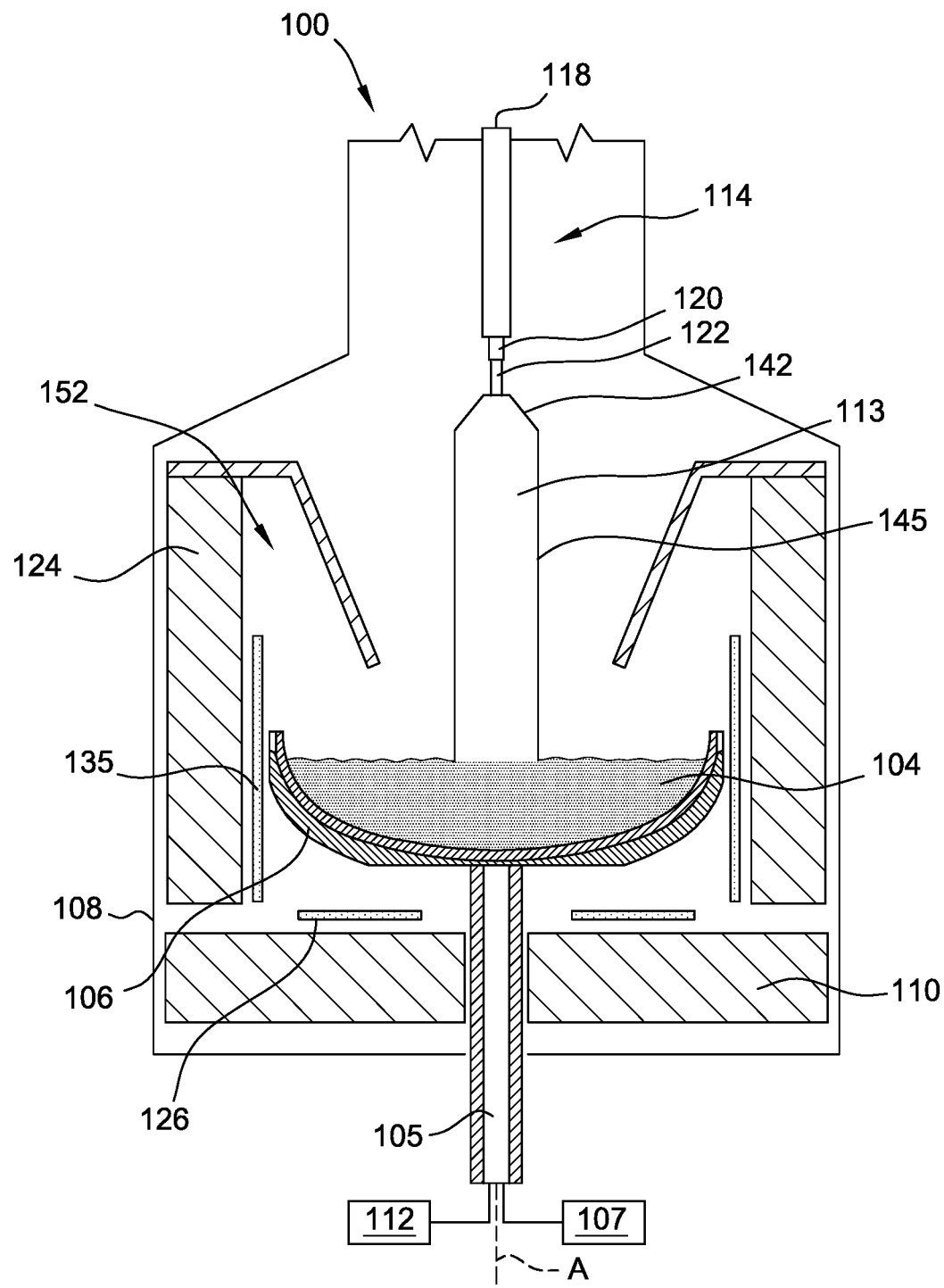
FIG. 6 is a is a cross-section of the ingot puller apparatus during ingot growth.

Once the melt is fully formed, the silicon feed tube 190 is removed from the growth chamber 152. The seed crystal 122 (FIG. 5) is lowered and contacted with the surface 111 of the melt 104. The pulling mechanism 114 is operated to pull the seed crystal 122 from the melt 104. Referring now to FIG. 6, the ingot 113 includes a crown portion 142 in which the ingot transitions and tapers outward from the seed crystal 122 to reach a target diameter. The ingot 113 includes a constant diameter portion 145 or cylindrical "main body" of the crystal which is grown by increasing the pull rate. The main body 145 of the ingot 113 has a relatively constant diameter. The ingot 113 includes a tail or end-cone (not shown) in which the ingot tapers in diameter after the main body 145. When the diameter becomes small enough, the ingot 113 is then separated from the melt 104. Generally, the crystal growth process is a batch process in which solid silicon is initially added to the crucible assembly to form a silicon melt without additional solid-silicon being added to the crucible assembly 102 during crystal growth (as opposed to a continuous Czochralski process in which an amount of silicon is added to the crucible assembly during ingot growth).

The ingot puller apparatus 100 includes a side heater 135 and a susceptor 106 that encircles the crucible assembly 102 to maintain the temperature of the melt 104 during crystal growth. The side heater 135 is disposed radially outward to the crucible sidewall 131 as the crucible assembly 102 travels up and down the pull axis A. The side heater 135 and bottom heater 126 may be any type of heater that allows the side heater 135 and bottom heater 126 to operate as described herein. In some embodiments, the heaters 135, 126 are resistance heaters. The side heater 135 and bottom heater 126 may be controlled by a control system (not shown) so that the temperature of the melt 104 is controlled throughout the pulling process.

The ingot puller apparatus 100 may include a heat shield 151. The heat shield 151 may shroud the ingot 113 and may be disposed within the crucible assembly 102 during crystal growth (FIG. 6). The ingot puller apparatus 100 may include an inert gas system to introduce and withdraw an inert gas such as argon from the growth chamber 152.

Figure 7:
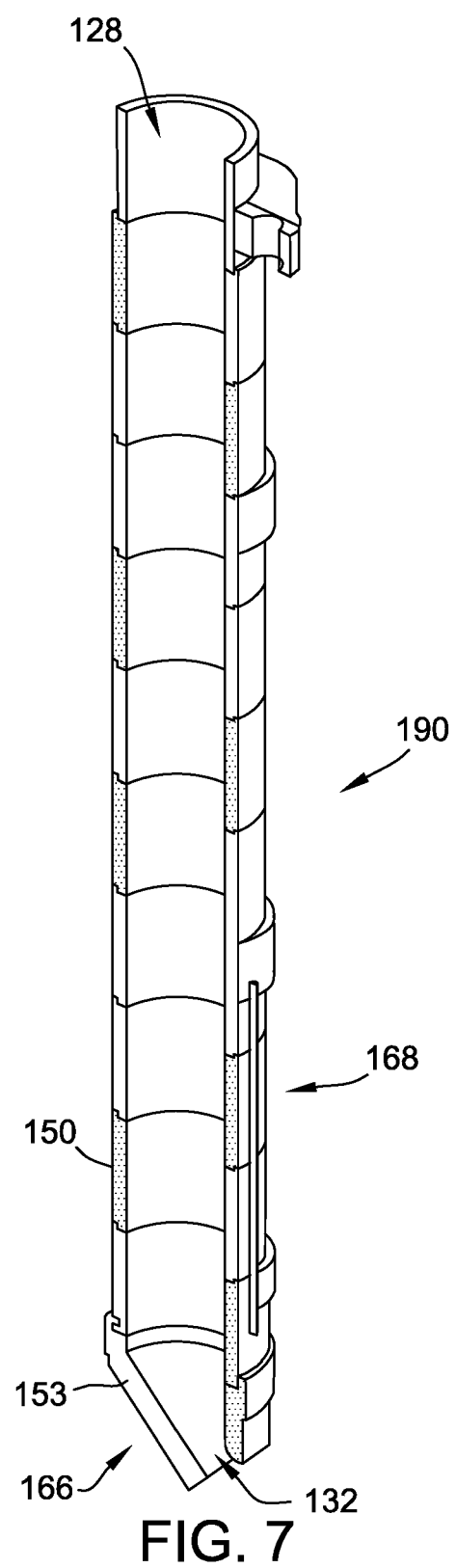
FIG. 7 is a cross-section of the silicon feed tube.

Referring now to FIG. 7, the silicon feed tube 190 includes an inlet 128 (which may be engaged with a feed tray disposed above the tube 190) and an outlet 132. The silicon feed tube 190 includes a conduit portion 150 through which the solid silicon travels. A kick plate 153 disposed below the conduit portion 150 directs solid silicon into the crucible assembly 102 (e.g., away from the center of the crucible assembly as shown in FIG. 11). The conduit portion 150 of the silicon feed tube 190 includes baffles (not shown) which control the speed of the solid silicon through the tube 190. In the illustrated embodiment, the silicon feed tube 190 includes a guide section 166 (FIG. 8) and tube section 168 (FIG. 7) disposed above the guide section 166. The guide section 166 and tube section 168 may be connected by any suitable method such as by friction fit, threads, adhesives, or fasteners (e.g., grooves and pins, flanges, or couplings). While the guide section 166 and tube section 168 of the silicon feed tube 190 are shown and described herein as separate components that are connected, in other embodiments the guide section 166 and tube section 168 are formed from a single piece (i.e., integral). The tube section 168 may also include various sections which are interconnected.

Figure 8:
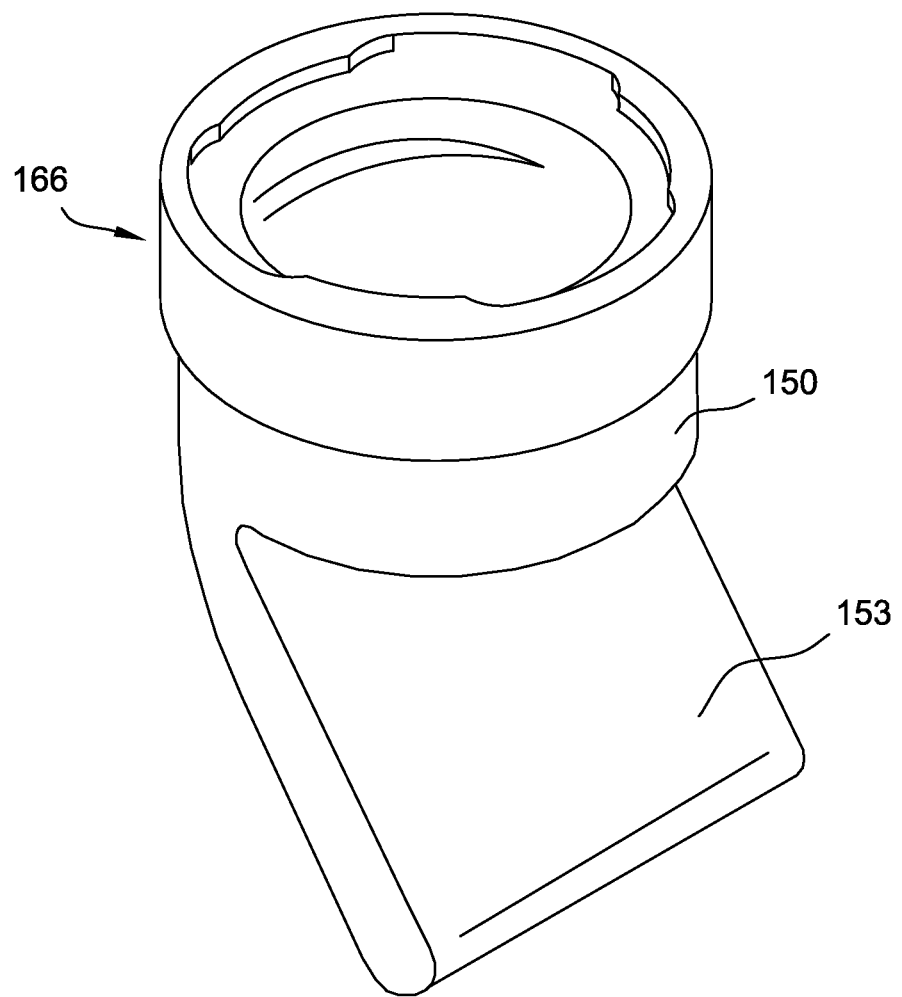
FIG. 8 is a perspective view of the guide section of the silicon feed tube.

In the illustrated embodiment, the kick plate 153 is part of the guide section 166. As shown in FIG. 8, the guide section 166 also includes at least part of the conduit portion 150 of the tube 190. The remainder of the conduit portion 150 is part of the tube section 168 (FIG. 7). In other embodiments, the tube section 168 may include the entire conduit portion 150 of the tube 190.

The illustrated silicon feed tube 190 is an example and the silicon feed tube may be modified (e.g., by including additional or less sections or by including various bends) without departing from the scope of the present disclosure.

In some embodiments of the present disclosure, the silicon feed tube 190 or any portions thereof (e.g., kick plate 153, conduit portion 150, guide section 166, and/or tube section 178) are made of silicon.

Figure 9:
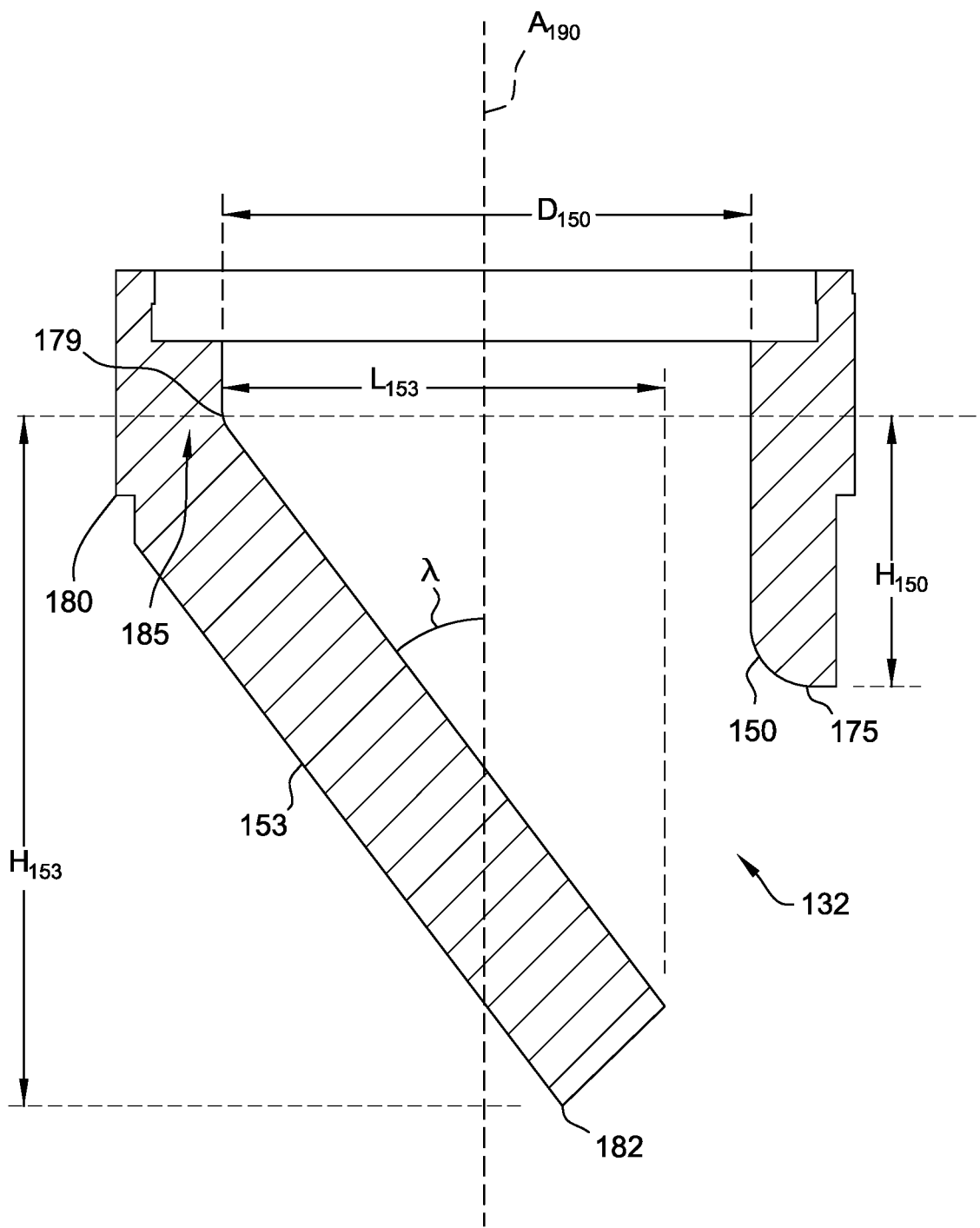
FIG. 9 is a cross-section of the guide section of the silicon feed tube.

Referring now to FIG. 9, the kick plate 153 forms an angle λ with the longitudinal axis $A_{190}$ of the feed tube 190. The angle λ may range between 20° and 60°.

The conduit portion 150 of the silicon feed tube 190 has an inner diameter $D_{150}$ (i.e., the inner diameter where the conduit portion 150 meets the kick plate 153 such as when the diameter of the conduit portion 150 varies). The kick plate 153 extends across at least a portion of the inner diameter as indicated by $L_{153}$. In some embodiments, the kick plate 153 extends across at least 60% of the inner diameter $D_{150}$ (i.e., the ratio $L_{153}/D_{150}$ is at least 0.6). In other embodiments, the kick plate extends across at least 70% of the inner diameter $D_{150}$ of the conduit portion 150, or extends across at least 75%, at least 80%, from 60% to 100%, from 70% to 100%, from 80% to 100%, from 60% to 90%, or from 70% to about 90% of the inner diameter $D_{150}$ of the conduit portion 150.

The kick plate 153 and conduit portion 150 of the silicon feed tube 190 form an inner corner 179 and an outer corner 180. The kick plate 153 has an upper end 185 that is aligned with the inner corner 179 and has a lower end 182. The kick plate 153 has a height $H_{153}$ that extends from its upper end 185 to the lower end 182.

The conduit portion 150 has a lower end 175. In the illustrated embodiment, the conduit portion 150 (e.g., the portion opposite the kick plate 153 as in the illustrated embodiment) includes a portion that vertically overlaps the kick plate 153. The length of this portion that overlaps the kick plate 153 is indicated by $H_{150}$ in FIG. 9. In some embodiments, the conduit portion 150 overlaps less than 70% of the height $H_{153}$ of the kick plate (i.e., the ratio $H_{150}/H_{153}$ is less than 0.7). In some embodiments, the conduit portion 150 overlaps less than 60% of the height of the kick plate or less than 50%, less than 40%, from 20% to 70%, or from 20% to 60% of the height of the kick plate 153.

Figure 10:
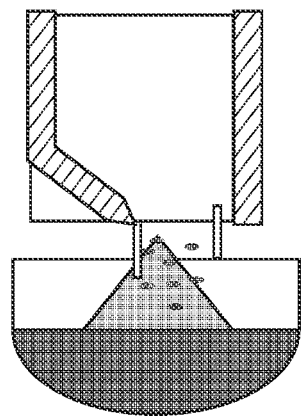
FIG. 10 is a schematic of an island of solid silicon having a pyramidal shape and an island of solid silicon having a volcano shape.
Figure 10:
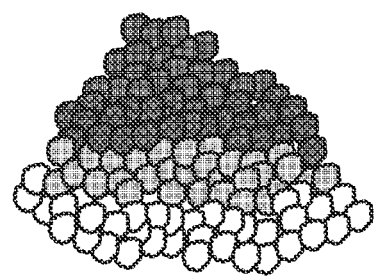
Figure 10:
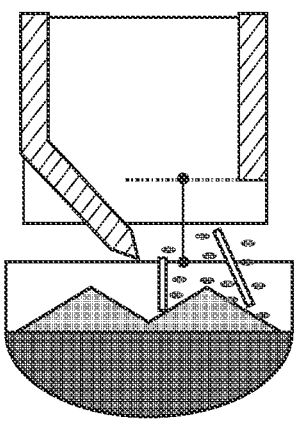
Figure 10:
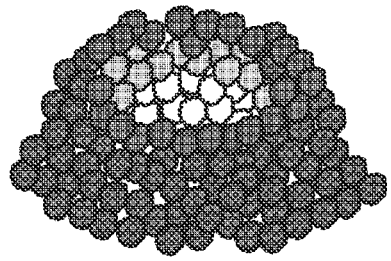

Compared to conventional silicon feed tubes, the silicon feed tubes of the present disclosure have several advantages. By using a kick plate that extends to at least 60% of the inner diameter of the conduit portion, solid silicon exits the silicon feed tube away from the center of the crucible assembly which results in the island of solid silicon that floats on the melt having a "volcano" shape rather than a pyramid shape (FIG. 10). The volcano-shaped island is more stable on the melt and less susceptible to tipping or overturning which allows meltdown to proceed with less manual control. The volcano-shaped island also reduces melt time and reduces the amount of heater power needed to meltdown the solid silicon. By using a conduit portion that overlaps less than 70% of the height of the kick plate (e.g., from 20% to 70%), the radial distance at which solid silicon is discharged from the tube may be improved and more precisely controlled.

EXAMPLES

The processes of the present disclosure are further illustrated by the following Examples. These Examples should not be viewed in a limiting sense.

Example 1: Reduction in Feeding Time and Heater Power

A silicon feed tube having a guide section shown in FIG. 9 was used to add solid silicon to an initial melt of silicon. A conventional silicon feed tube having a guide tube with a kick plate that extends less than 60% across the inner diameter of the conduit portion and that had a conduit portion that overlaps greater than 70% of the height of the kick plate was also used to add solid silicon to an initial melt of silicon.

Figure 12:
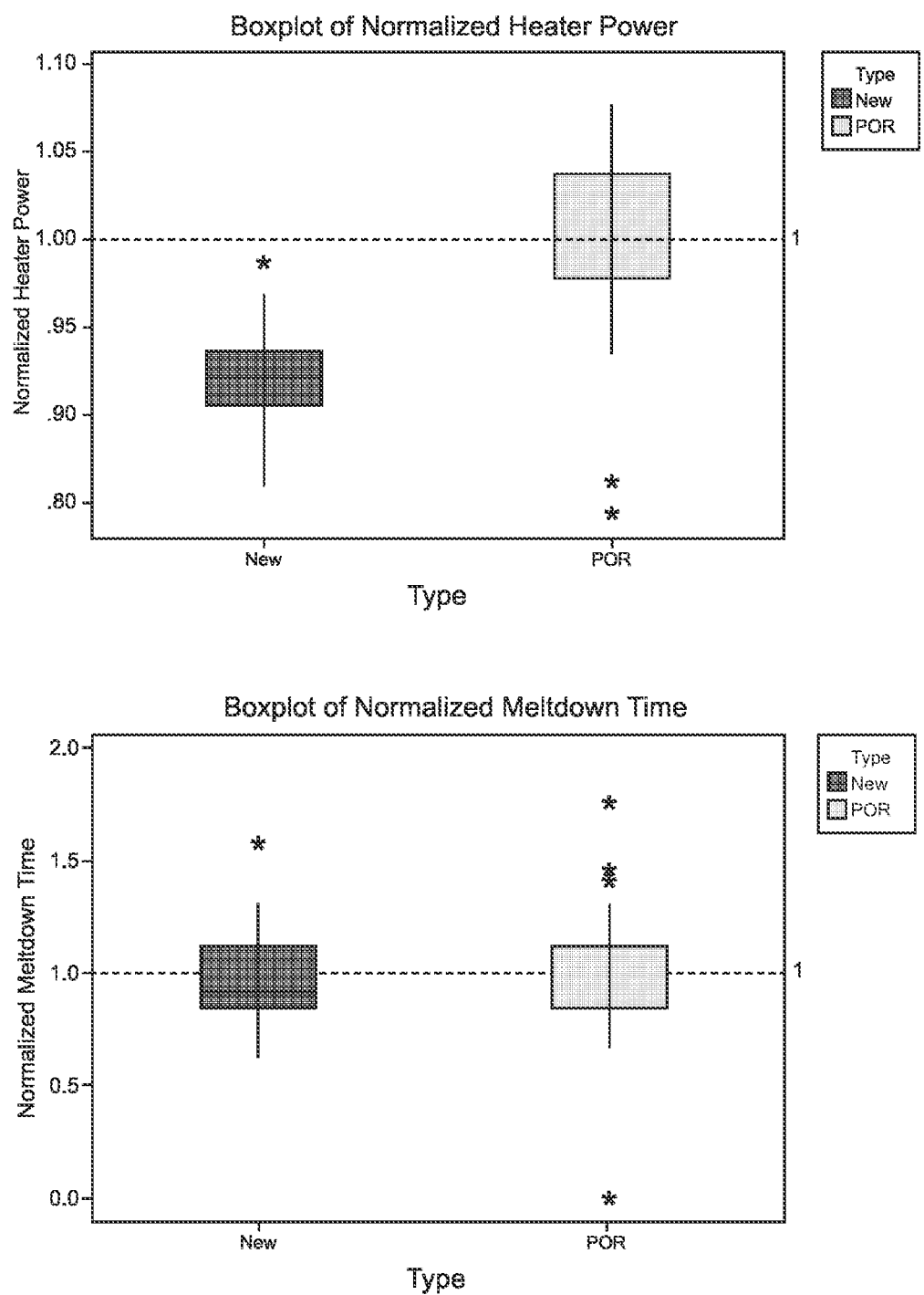
FIG. 12 includes box plots of heater power and meltdown time between a conventional silicon feed tube and the silicon feed tube shown in FIG. 7.

As shown in FIG. 12, use of the feed tube having the guide section shown in FIG. 9 ("New") reduced the total meltdown time by about 2 hours and reduced the heater power during meltdown by 10 kW relative to the conventional silicon feed tube ("POR").

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for manufacturing a single crystal silicon ingot, the method comprising:
   adding a solid-phase silicon charge to a crucible disposed within a growth chamber;
   melting the solid-phase silicon charge to form an initial melt, the initial melt having a surface;
   lowering a silicon feed tube into the growth chamber, the silicon feed tube comprising:
      a conduit portion having an inner diameter; and
      a kick plate extending from and disposed below the conduit portion, the kick plate extending from 60% to 90% of the inner diameter of the conduit portion;
   adding additional solid-phase silicon to the initial melt through the silicon feed tube, the additional solid-phase silicon being chunk solid-phase silicon, the additional solid-phase silicon collecting on the surface of the initial melt and forming an island having a volcano shape;
   removing the silicon feed tube from the growth chamber;
   melting the island of additional solid-phase silicon to increase the size of the melt;
   lowering a seed crystal to contact the surface of the melt; and
   and raising the seed crystal to form a single crystal silicon ingot.

2. The method as set forth in claim 1 wherein the kick plate extends across from 70% to 90% of the inner diameter of the conduit portion.

3. The method as set forth in claim 1 wherein the silicon feed tube comprises a longitudinal axis, the kick plate and longitudinal axis forming an angle between 20° and 60°.

4. The method as set forth in claim 1 wherein the kick plate has a height, wherein the conduit portion overlaps less than 70% of the height of the kick plate.

5. The method as set forth in claim 1 wherein the silicon feed tube and single crystal silicon ingot move along a common axis.

6. A method for manufacturing a single crystal silicon ingot, the method comprising:
   adding a solid-phase silicon charge to a crucible disposed within a growth chamber;
   melting the solid-phase silicon charge to form an initial melt, the initial melt having a surface;
   lowering a silicon feed tube into the growth chamber, the silicon feed tube comprising:
      a conduit portion having an inner diameter; and
      a kick plate extending from and disposed below the conduit portion, the kick plate extending from 60% to 90% of the inner diameter of the conduit portion;
   adding additional solid-phase silicon to the initial melt through the silicon feed tube, the additional solid-phase silicon being chunk solid-phase silicon, the additional solid-phase silicon collecting on the surface of the initial melt;
   removing the silicon feed tube from the growth chamber;
   melting the island of additional solid-phase silicon to increase the size of the melt;
   lowering a seed crystal to contact the surface of the melt; and
   and raising the seed crystal to form a single crystal silicon ingot, the silicon feed tube and single crystal silicon ingot moving along a common axis.

7. The method as set forth in claim 6 wherein the kick plate extends across from 70% to 90% of the inner diameter of the conduit portion.

8. The method as set forth in claim 6 wherein the silicon feed tube comprises a longitudinal axis, the kick plate and longitudinal axis forming an angle between 20° and 60°.

9. The method as set forth in claim 6 wherein the kick plate has a height, wherein the conduit portion overlaps less than 70% of the height of the kick plate.

\* \* \* \* \*